United States Patent
Uchida et al.

(10) Patent No.: US 8,839,072 B2
(45) Date of Patent: Sep. 16, 2014

(54) ACCESS CONTROL APPARATUS, STORAGE APPARATUS, AND METHOD

(75) Inventors: Atsushi Uchida, Kawasaki (JP); Terumasa Haneda, Kawasaki (JP); Yoko Kawano, Kawasaki (JP); Emi Cho, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 117 days.

(21) Appl. No.: 13/297,972

(22) Filed: Nov. 16, 2011

(65) Prior Publication Data
US 2012/0144268 A1     Jun. 7, 2012

(30) Foreign Application Priority Data

Dec. 2, 2010    (JP) ................. 2010-269042

(51) Int. Cl.
| | | |
|---|---|---|
| G11C 29/00 | (2006.01) | |
| H03M 13/00 | (2006.01) | |
| G06F 11/10 | (2006.01) | |
| G11C 29/02 | (2006.01) | |
| G11C 29/04 | (2006.01) | |
| H03M 13/15 | (2006.01) | |
| G11C 16/00 | (2006.01) | |

(52) U.S. Cl.
CPC .... G06F 11/1012 (2013.01); G11C 2029/0411 (2013.01); G11C 29/028 (2013.01); H03M 13/1515 (2013.01); G11C 16/00 (2013.01)
USPC ........................ 714/763; 714/758; 714/768

(58) Field of Classification Search
USPC ........................... 714/758, 763, 768
See application file for complete search history.

(56) References Cited

U.S. PATENT DOCUMENTS

| | | | | |
|---|---|---|---|---|
| 7,774,681 B2 * | 8/2010 | Earhart et al. | ................. | 714/763 |
| 7,787,297 B2 * | 8/2010 | Jeon et al. | ................. | 365/185.05 |
| 8,347,183 B2 * | 1/2013 | Yoon et al. | ..................... | 714/766 |

(Continued)

FOREIGN PATENT DOCUMENTS

| | | |
|---|---|---|
| JP | 2004-164634 | 6/2004 |
| JP | 2004-272476 A | 9/2004 |

(Continued)

OTHER PUBLICATIONS

Pantazi, A.; Sebastian, A.; Antonakopoulos, T.A.; Bächtold, P.; Bonaccio, A.R.; Bonan, J.; Cherubini, G.; Despont, M.; DiPietro, R.A.; Drechsler, U.; Dürig, U.; Gotsmann, B.; Häberle, W.; Hagleitner, C.; Hedrick, J.L.; Jubin, D.; Knoll, A.; Lantz, M.A.; Pentarakis, J.; Pozidis, H.; Pratt, R. C.; Rothuizen, H.; Stutz, R.; Varsamou, M.; Wiesmann, D.*

(Continued)

*Primary Examiner* — Cynthia Britt
(74) *Attorney, Agent, or Firm* — Fujitsu Patent Center

(57) ABSTRACT

An access control apparatus for controlling an access to a storage device, the access control apparatus includes a measuring unit configured to measure the time to erase data stored in the storage device, and a determination unit configured to determine a data size of an error correcting code added to data stored in the storage device in accordance with the time measured by the measuring unit. The access control apparatus includes a generation unit configured to generate the error correcting code having the data size determined by the determination unit, and an access controller configured to write the data and the error correcting code generated by the generation unit into the storage device.

15 Claims, 18 Drawing Sheets

(56) References Cited

U.S. PATENT DOCUMENTS

| | | | |
|---|---|---|---|
| 2004/0083333 A1 | 4/2004 | Chang et al. | |
| 2005/0283647 A1 | 12/2005 | Ishidoshiro et al. | |
| 2007/0245068 A1* | 10/2007 | Yero | 711/103 |
| 2008/0229147 A1* | 9/2008 | Earhart et al. | 714/15 |
| 2010/0161883 A1 | 6/2010 | Kurashige | |
| 2011/0004805 A1* | 1/2011 | Seo | 714/763 |
| 2011/0252289 A1* | 10/2011 | Patapoutian et al. | 714/763 |
| 2012/0042200 A1* | 2/2012 | Takeuchi et al. | 714/6.2 |
| 2012/0221922 A1* | 8/2012 | Bennett | 714/758 |

FOREIGN PATENT DOCUMENTS

| | | |
|---|---|---|
| JP | 2005-196658 A | 7/2005 |
| JP | 2007-316779 | 12/2007 |
| JP | 4439578 | 3/2010 |
| WO | 2012/058328 A1 | 5/2012 |

OTHER PUBLICATIONS

JPOA—Office Action of Japanese Patent Application No. 2010-269042 dated Apr. 8, 2014 with Partial Translation.

* cited by examiner

FIG. 3

| ADR | BAD BLK CODE | ECC SIZE | | | | | | |
|---|---|---|---|---|---|---|---|---|
| | | Page x0 | Page x1 | Page x2 | Page x3 | Page x4 | Page x5 | Page x6 |
| 0 | 0 | 0 | 0 | 0 | 0 | 0 | 0 | 0 |
| 1 | 1 | 0 | XXX | 0 | XXX | 0 | 0 | XXX |
| 2 | 1 | XXX | XXX | XXX | XXX | XXX | XXX | XXX |
| 3 | 2 | n/a | n/a | n/a | n/a | n/a | n/a | n/a |
| ... | ... | ... | ... | ... | ... | ... | ... | ... |

FIG. 4

| Erase TIME (tERS) | ECC SIZE |
|---|---|
| Typical VALUE | DEFAULT=N |
| tERS < Typical VALUE | DEFAULT=N |
| Typical VALUE < tERS < Typical VALUE × 2 | N × (tERS/Typical VALUE) |

FIG. 9

| ADR | BAD BLK CODE | ECC SIZE | | | | | | |
|---|---|---|---|---|---|---|---|---|
| | | Page x0 | Page x1 | Page x2 | Page x3 | Page x4 | Page x5 | Page x6 |
| 0 | 0 | 0 | 0 | 0 | 0 | 0 | 0 | 0 |
| 1 | 1 | 0 | (a) | 0 | (b) | 0 | 0 | (c) |
| 2 | 1 | XXX | XXX | XXX | XXX | XXX | XXX | XXX |
| 3 | 2 | n/a | n/a | n/a | n/a | n/a | n/a | n/a |
| ... | ... | ... | ... | ... | ... | ... | ... | ... |

ACCESS CONTROL APPARATUS, STORAGE APPARATUS, AND METHOD

CROSS-REFERENCE TO RELATED APPLICATION

This application is based upon and claims the benefit of priority of the prior Japanese Patent Application No. 2010-269042, filed on Dec. 2, 2010, the entire contents of which are incorporated herein by reference.

FIELD

The embodiments discussed herein are related to an access control apparatus, a storage apparatus, and a method of controlling a storage apparatus.

BACKGROUND

To date, flash memories, which are nonvolatile semiconductor memories, have been used. A controller controlling such a flash memory writes data and reads data for each plurality of bits called a page, and erases data for each block including a plurality of the pages.

Such a controller performs erase processing of erasing data from a flash memory for each block. And when the controller writes data, the controller searches for a free block in which data was erased, and writes new data on the detected free block.

Also, the controller generates an ECC (Error Correcting Code) which enables detection of erroneous data having been written and correction of data, and stores the ECC with data into the flash memory. Here, a data size of the ECC generated by the controller is determined by a fixed value set by an initial setting.

And when the controller reads data from the flash memory, the controller reads the ECC from the flash memory with data, detects an error of the read data using the ECC, and performs data correction processing.

Incidentally, in the above-described related-art technique, there has been a problem in that a data size of a generated ECC is constant, and thus reliability of data stored in the flash memory becomes low. That is to say, in a flash memory, cells of the flash memory are deteriorated each time data erase processing and data write processing are performed, and thus a possibility of writing erroneous data becomes high.

Accordingly, when a data size of an ECC for data stored in a deteriorated cell is small, it is not possible to correct the data properly, and thus reliability of the data stored in the flash memory becomes low. In this regard, it is thought that the reliability of the data is improved by increasing the data size of the ECC uniformly. However, it takes more time for data-error detection processing and data correction processing with an increase in the data size of the ECC. Accordingly, it also takes time for data-error detection processing and data correction processing on data stored in cells that have not deteriorated, and thus performance of reading data from the flash memory deteriorates.

SUMMARY

An access control apparatus for controlling an access to a storage device, the access control apparatus includes a measuring unit configured to measure the time to erase data stored in the storage device, a determination unit configured to determine a data size of an error correcting code added to data stored in the storage device in accordance with the time measured by the measuring unit, a generation unit configured to generate the error correcting code having the data size determined by the determination unit, and an access controller configured to write the data and the error correcting code generated by the generation unit into the storage device.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 3 is a diagram illustrating an example of a bad-BLK management table.

FIG. 4 is a diagram illustrating a relationship between time needed for erase processing and an ECC data size.

FIG. 9 is a diagram illustrating an example of a bad-BLK management table.

DESCRIPTION OF THE EMBODIMENTS

Preferred embodiments of the present techniques will be explained with reference to accompanying drawings.

In the following, detailed descriptions will be given of embodiments of the access control apparatus, the storage apparatus and the method for controlling the storage apparatus with reference to the drawings. In this regard, this technique will not be limited to the embodiments.

First Embodiment

In the following embodiments, descriptions will be given of a configuration and a processing flow of a NAND-flash memory controller according to a first embodiment in sequence, and effects of the first embodiment will be described last.

[Configuration of NAND-Flash Memory Controller]

Figure 1:
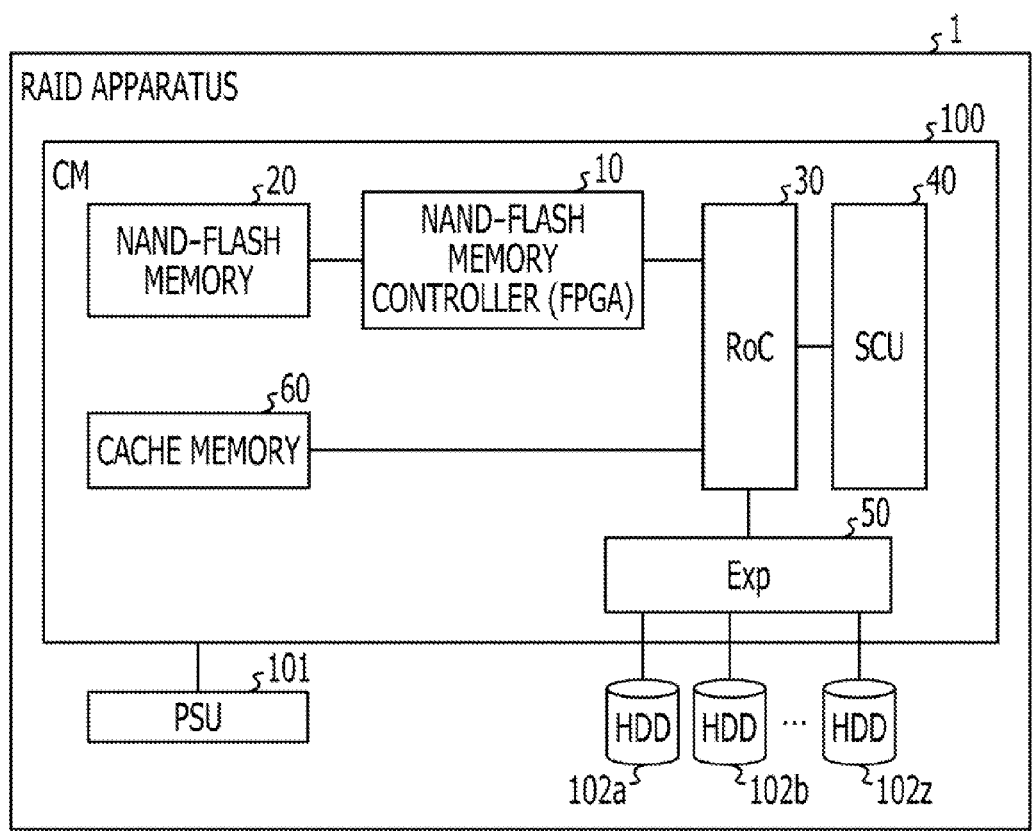
FIG. 1 is a block diagram illustrating a configuration of a RAID apparatus including a NAND-flash memory controller according to a first embodiment.

First, a description will be given of an example of a configuration of a RAID (Redundant Arrays of Independent (Inexpensive) Disks) apparatus including the NAND-flash memory controller according to the first embodiment using FIG. 1. FIG. 1 is a block diagram illustrating the configuration of the RAID apparatus including the NAND-flash memory controller according to the first embodiment. As illustrated in FIG. 1, the RAID apparatus 1 has a CM (Controller Module) 100, a PSU (Power Supply Unit) 101, and HDDs (Hard Disk Drives) 102a to 102z.

The CM 100 is a control unit that manages a cache memory, controls an interface with a host, and controls the individual HDDs 102a to 102z. Also, the CM 100 has a NAND-flash memory controller 10, a NAND-flash memory 20, a RoC (RAID-on-Chip) 30, and an SCU (Super Capacitor Unit) 40, an Exp (Expander) 50, and a cache memory 60.

The NAND-flash memory controller 10 is an FPGA (Field Programmable Gate Array), which is an integrated circuit controlled by a predetermined program, and has a DMA (Direct Memory Access) engine. The DMA is a method in which data transfer is performed between the apparatus and an RAM (Random Access Memory) without involvement of a CPU (Central Processing Unit). In the present embodiment, the NAND-flash memory controller 10, which is an FPGA, is equipped with a DMA having an additional function in which the longer time a page has needed for erasing, the larger a size of an ECC of the page is created in order to create an ECC having a larger data size as the page is more deteriorated. In this regard, a detailed description will be given of a configuration of the NAND-flash memory controller 10 using FIG. 2 later.

The NAND-flash memory 20 is a nonvolatile semiconductor memory. For example, the NAND-flash memory 20 functions as a backup storage device for saving data in a volatile cache memory 60 at the time of a power failure.

The RoC 30 is a control apparatus controlling the CM 100 overall, and is a processing unit including a firmware for performing backup processing of the cache memory 60, for controlling the interface with the host, and for managing the cache memory 60.

The SCU 40 is a large-capacitance capacitor. The SCU 40 supplies power to the RoC 30 in a battery-free manner when a power failure occurs in the RAID apparatus 100. The EXP (Expander) 50 is a processing unit for relaying user data transmitted and received between the RoC 30 and the HDDs 102a to HDD 102z.

The cache memory 60 is a volatile memory, such as a DDR SDRAM (Double Data Rate Synchronous DRAM), etc. For example, the cache memory 60 temporarily stores data to be written in the HDD. And in the case where data is unable to be written in the HDD because of a power failure, etc., the cache memory 60 temporarily saves data to be written into the NAND-flash memory 20.

The PSU (Power Supply Unit) 101 is an apparatus supplying power to the RAID apparatus 100. When a power failure occurs, the PSU stops to supply power to the RAID apparatus 100. In this regard, as described above, in this case, power is supplied to the RAID apparatus 100 by discharge of the SCU 40. The HDD 102a to HDD 102z constitute RAID groups, and data is divided in accordance with levels of speed and security. The HDD 102a to HDD 102z include storage media (disks), etc., on which user data is written and programs are stored.

Figure 2:
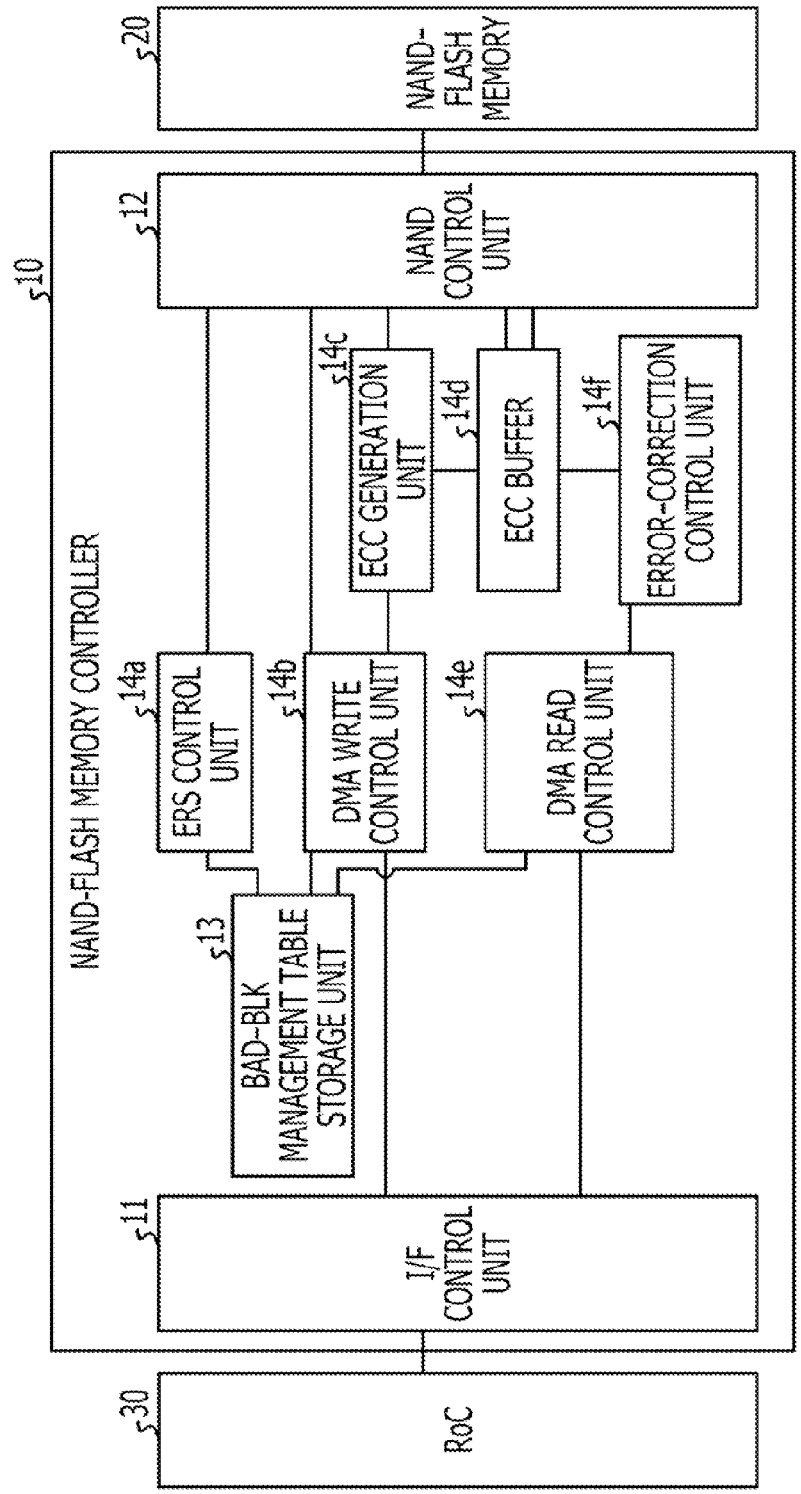
FIG. 2 is a block diagram illustrating a configuration of the NAND-flash memory controller according to the first embodiment.

Next, a description will be given of a configuration of the NAND-flash memory controller according to the first embodiment using FIG. 2. FIG. 2 is a block diagram illustrating the configuration of the NAND-flash memory controller according to the first embodiment. As illustrated in FIG. 2, the NAND-flash memory controller 10 includes an I/F control unit 11, a NAND control unit 12, a bad-BLK management table storage unit 13, an ERS control unit 14a, a DMA write control unit 14b, an ECC generation unit 14c, an ECC buffer 14d, a DMA read control unit 14e and an error-correction control unit 14f. In the following, descriptions will be given of processing of these individual units.

The I/F control unit 11 controls communication on various kinds of information that is exchanged with the RoC 30 to be connected. For example, when the I/F control unit 11 receives a data write request, the I/F control unit notified the request to the DMA write control unit 14b. Also, when the I/F control unit 11 receives a data read request from the RoC 30, the I/F control unit 11 notifies the request to the DMA read control unit 14e. Also, the I/F control unit 11 receives data read from the NAND-flash memory 20 from the DMA read control unit 14e, and notifies the data to the RoC 30.

The NAND control unit 12 controls writing data into and reading data from the NAND-flash memory 20 to be connected. For example, when the NAND control unit 12 receives a write request from the DMA write control unit 14b, the NAND control unit 12 performs write processing of the data and the ECC into the NAND-flash memory 20. Also, when the NAND control unit 12 receives a read request from the DMA read control unit 14e, the NAND control unit 12 performs read processing of the data and the ECC from the NAND-flash memory 20.

The bad-BLK management table storage unit 13 stores a bad-BLK management table in which whether a bad block or not is stored. Here, a "bad block" indicates a block on which writing cache data is not complete within a predetermined period of time because of wear of the NAND-flash memory 20. And the bad block will not be used for a data write block. For example, as illustrated in FIG. 3, the bad-BLK management table storage unit 13 stores "ADR", which is an address value given to each block, "bad BLK code", which indicates whether the block is a bad block or not, and "ECC size", which indicates a data size of an expansion of an ECC for each page. FIG. 3 is a diagram illustrating an example of the bad-BLK management table.

In the bad-BLK management table, if the bad BLK code is "0", it indicates that the block is a good block. Also, in the bad-BLK management table, if the bad BLK code is "0", an ECC size corresponding to data of each page pertaining to that block is an initialized value (In the following, called a fixed value). Accordingly, "0" is stored in the ECC size, which is a data size of an expansion of the ECC. In this regard, the fixed value of the ECC size is stored in a predetermined storage area of the bad-BLK management table storage unit 13.

Also, in the bad-BLK management table, if the bad BLK code is "1", it indicates that the block is a good block having a variable length ECC size. Here, the good block means a block that may be used for data reading and writing. Also, in the bad-BLK management table, if the bad BLK code is "1", an ECC size corresponding to data of each page pertaining to that block is stored. In the example in FIG. 3, "xxx" is described in an item of the ECC size, but in reality, the number of bytes is stored in the table. Here, the number of bytes stored in an item of an ECC size indicates a data size of an expanded ECC from a fixed value. That is to say, if "64" bytes is stored in an item of the ECC size, the ECC size becomes 64 bytes added to the fixed value.

Also, in the bad-BLK management table, when the bad BLK code is "2", it indicates that the block is a bad block. Also, in the bad-BLK management table, if the bad BLK code is "2", it indicates that an ECC size corresponding to data of each page pertaining to that block becomes "n/a (no active)". That is to say, if the bad BLK code is "2", the block is a bad block, and thus the block is not used. In this regard, a detailed description will be given on how a bad BLK code and an ECC size are determined in a description of the ERS control unit 14a.

The ERS control unit 14a controls to perform erase processing, which is erase processing on data stored in the NAND-flash memory 20. For example, when the ERS control unit 14a receives an erase request from the RoC 30, the ERS control unit 14a transmits an ERS request for requesting erasure of data stored in the NAND-flash memory 20 to the NAND control unit 12.

Also, when an ERS request is notified from the RoC 30, the ERS control unit 14a measures time needed for erasing data stored in the NAND-flash memory 20, and determines a data size of an error correcting code in accordance with the measured time. For example, the ERS control unit 14a measures time, as time needed for erasing data, from transmission of an ERS request to the NAND control unit 12 until reception of a completion response indicating completion of the erase processing from the NAND control unit 12. And the ERS control unit 14a determines a data size of an error correcting code in accordance with the measured time each time an ERS request is notified from the RoC 30 to the ERS control unit 14a.

Here, a description will be specifically given of processing of determining a data size of an error correcting code in accordance with the measured time using FIG. 4. FIG. 4 is a diagram illustrating a relationship between time needed for erase processing and an ECC data size. As illustrated in FIG. 4, if erase time (described as "tERS" in FIG. 4), which is time needed for erase processing, is equal to a standard value (typical value in FIG. 4), the ERS control unit 14a determines the ECC size to be "N", which is an initial setting value (described as "Default=N" in FIG. 4). Also, if the erase time is shorter than a standard value, the ERS control unit 14a determines the ECC size to be "N", which is an initial setting value.

And if the erase time is not longer than the standard value, the ERS control unit 14a determines a block having an erase time not longer than the standard value to be a good block, and stores "0" in an item of the bad BLK code of the NAND-bad-BLK management table. Here, for example, a value at first erase time may be used for the standard value of the erase time, or a standard value may be stored in the NAND-flash memory 20. In this regard, the standard value is changed by replacing a flash, etc.

Also, if the erase time is longer than the standard value and is shorter than two times the standard value, the ERS control unit 14a calculates an "initial setting value N×(tERS/Typical value), and determines the calculated value to be an ECC data size. After that, the ERS control unit 14a stores the determined value of the ECC data size in the NAND-bad-BLK management table. That is to say, the longer time needed for erasing a page has, the larger size of the ECC is created, and thus the more deteriorated the page, the larger data size of an ECC may be created. As a result, it is possible to improve reliability of data in the flash memory.

And if the erase time is longer than the standard value, and is shorter than two times the standard value, the ERS control unit 14a determines that block to be a good block, and stores "1" in an item of the bad BLK code of the NAND-bad-BLK management table. In this regard, if the erase time is not less than two times the standard value, the ERS control unit 14a determines an entire block including a page having the erase time not less than two times the standard value to be a bad block, and stores "2" in an item of the bad BLK code of the NAND-bad-BLK management table. Thereby, the ERS control unit 14a determines that the block including the page having the erase time two times or more the standard value will not be used after that.

Figure 5:
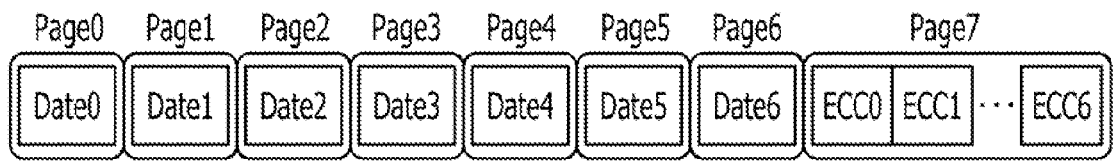
FIG. 5 is a diagram illustrating an example of a data structure of a NAND flash.

Here, a description will be given of a data structure stored in the NAND flash memory 20 using an example in FIG. 5. FIG. 5 is a diagram illustrating an example of a data structure of a NAND flash. As illustrated in FIG. 5, the NAND flash memory 20 stores data in pages 0 to 6, and stores ECCs in page 7 among pages 0 to 7. A page indicates a data area in which data is stored, and indicates a division unit for storing data of the NAND flash memory 20. Data is written and read for each of the pages.

Figure 6:
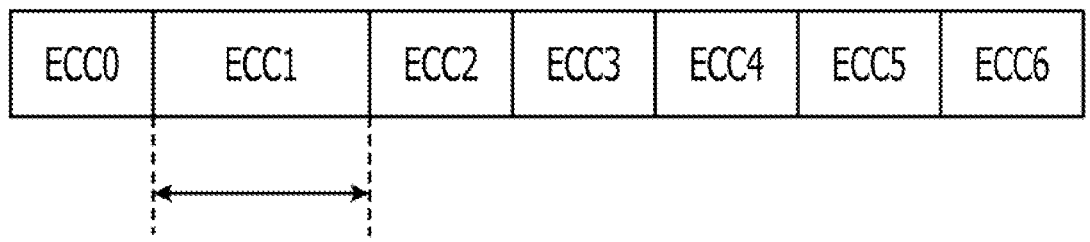
FIG. 6 is a diagram illustrating an example of an ECC data size.
Figure 7:
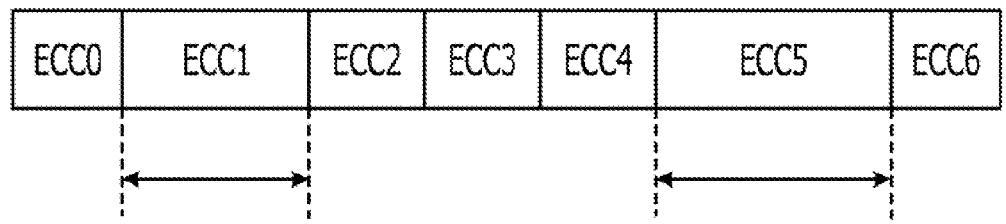
FIG. 7 is a diagram illustrating an example of an ECC data size.

The page 7 stores ECCs for detecting an error of data stored in pages 0 to 6 and correcting data, respectively. For example, as exemplified in FIG. 5, the page 7 stores ECCs in order of ECC0, ECC1, ... ECC6, corresponding to data stored in the pages 0 to 6, respectively. Also, a data size of each ECC, stored in the page 7, corresponding to a respective page is sometimes different for each ECC. For example, as illustrated in FIG. 6, if time needed for erase processing of data1 stored in page1 becomes longer than a standard value, a data size of "ECC1" becomes large. Also, as exemplified in FIG. 7, if time needed for erase processing of data5 stored in page5 together with data1 stored in page1 become longer than a standard value, data sizes of "ECC1" and "ECC5" become large. FIG. 6 and FIG. 7 are diagrams illustrating examples of ECCs. In this regard, in the case where an ECC data size is expanded, there is enough room for a capacity of the storage area in order to store ECCs, and thus for example, if ECC1 data becomes large, data of "ECC2" will not be overwritten.

In this manner, in the NAND-flash memory controller 10 according to the first embodiment, the page 7 stores only ECCs, and thus even if an ECC data size is changed, it is possible to easily manage the ECC. Also, as described above, the page 7 is structured such that the capacity of a storage area of each ECC has enough room in order to allow storing the ECC even if the ECC data size is expanded.

Figure 8:
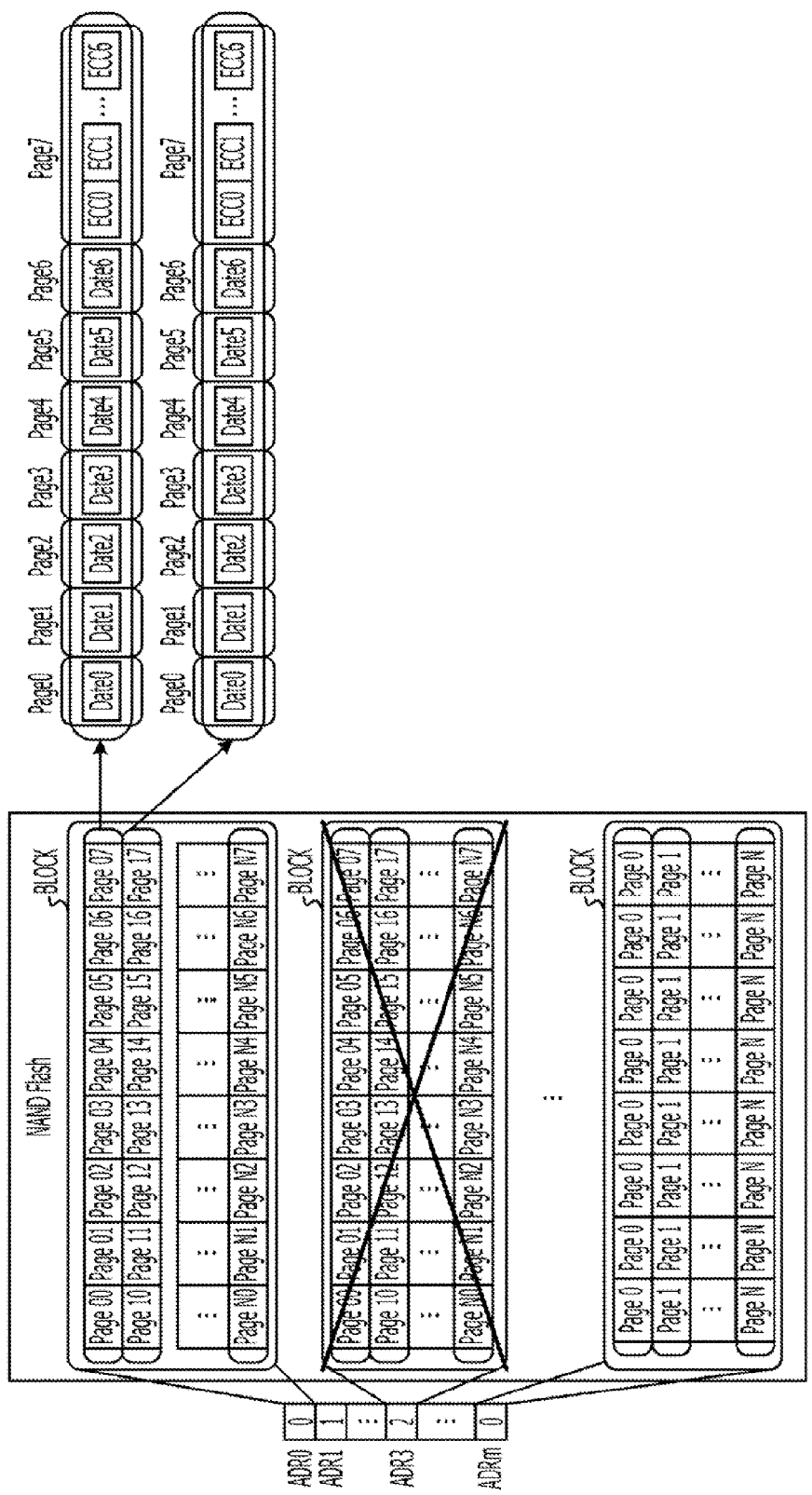
FIG. 8 is a diagram illustrating a relationship between a bad BLK code of the bad-BLK management table and NAND flash data.

Here, a description will be given of a relationship between the bad BLK code of the bad-BLK management table and NAND flash data using FIG. 8. FIG. 8 is a diagram illustrating a relationship between the bad BLK code of the bad-BLK management table and NAND flash data. As illustrated on a left side in FIG. 8, any one of the bad BLK codes "0", "1", and "2" is stored in association with an address of each block. Also, as illustrated in the middle of FIG. 8, the NAND-flash memory 20 manages data for each block including a plurality of pages Page00 to PageN7. Also, as illustrated on the right side of FIG. 8, the NAND-flash memory 20 stores Data0 to Data6 in Page0 to Page6, respectively, and stores ECCs of Data0 to Data6 in Page7.

And since a block having a bad BLK code of "2" is a bad block, the NAND-flash memory controller 10 degenerates that block. For example, in the example in FIG. 8, a block with an ADR of "3" has a bad BLK code of is "2", and thus the block with the ADR of "3" is degenerated, and is not used as a storage area after that.

Referring back to FIG. 2, the DMA write control unit 14b controls to perform data write processing on the NAND-flash memory 20. For example, when the DMA write control unit 14b receives a write request from the RoC 30 and data to be written, the DMA write control unit 14b reads the bad-BLK management table, and searches for a writable block. That is to say, the DMA write control unit 14b searches for a good block having an item of the bad BLK code of "0" or "1" in the bad-BLK management table. And the DMA write control unit 14b reads an ECC size of each page in the bad-BLK management table for the writable block.

And the DMA write control unit 14b controls to perform data write processing on each page of the writable block. And the DMA write control unit 14b determines a data size of the ECC data in accordance with the data size of the ECC read from the bad-BLK management table, and causes the ECC generation unit 14c to generate the ECC. That is to say, if an item of "ECC size" in the bad-BLK management table is "a" bytes, the DMA write control unit 14b causes to generate ECC data having a size of "a" bytes added to a fixed value of an initial setting.

Figure 10A:
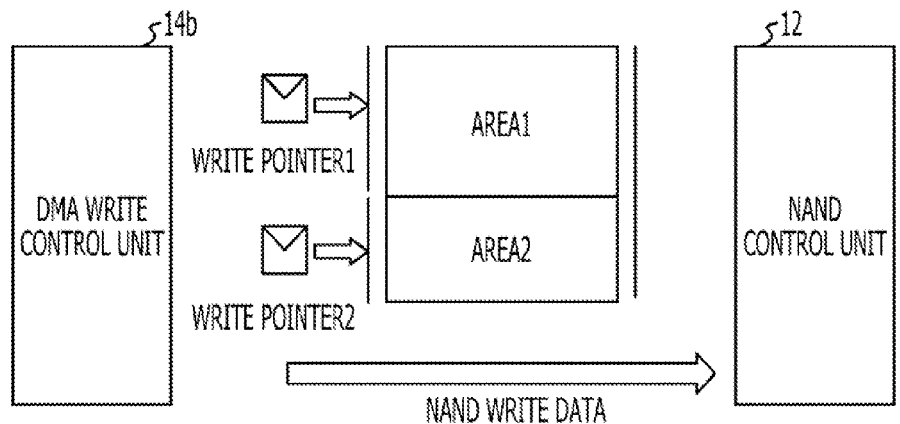
FIGS. 10A and 10B are explanatory diagrams of determination processing of an ECC-data write position.
Figure 10B:
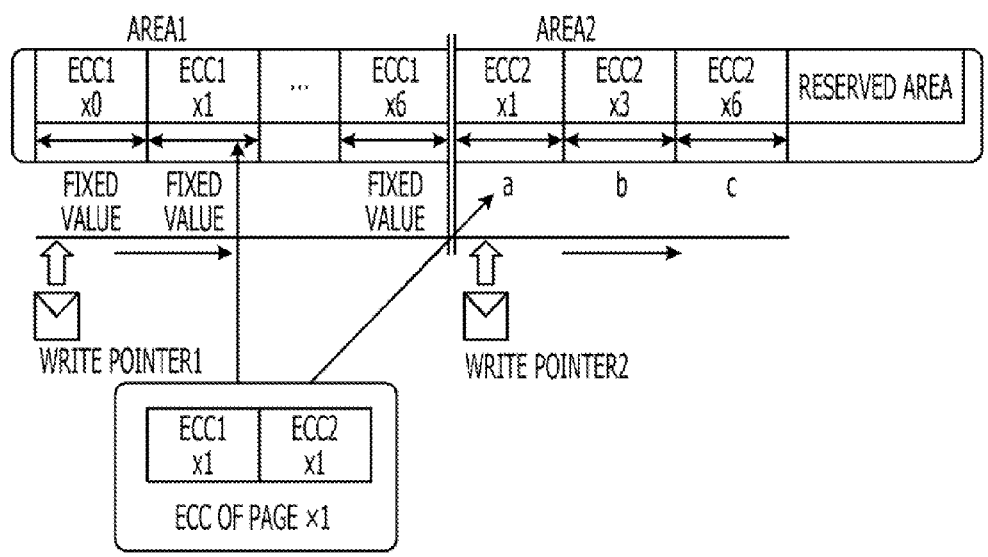

And the DMA write control unit 14b determines an ECC-data write position on the basis of the ECC size. After that, the DMA write control unit 14b writes ECC data in the NAND-flash memory 20. Here, a description will be given of determination processing of the ECC-data write position using FIG. 9, FIG. 10A, and FIG. 10B. FIG. 9 is a diagram illustrating an example of the bad-BLK management table. FIG. 10A and FIG. 10B are explanatory diagrams of determination processing of an ECC-data write position.

In the bad-BLK management table exemplified in FIG. 9, in a block having an ADR of "1", Page x1 has an ECC size of "a", Page x3 has an ECC size of "b", and Page x6 has an ECC size of "c". In FIG. 10A and FIG. 10B, a description will be given of determination processing of an ECC-data write position using an example of the bad-BLK management table exemplified in FIG. 9. As illustrated in FIG. 10A, the DMA write control unit 14b controls to move a write pointer 1 and a write pointer 2 so as to specify a write position of each data, and makes the NAND control unit 12 perform data write processing at the specified position. The write pointer 1 specifies a write position of an area 1, and the write pointer 2 specifies a write position of an area 2. The area 1 indicates an area for storing a fixed-value ECC among the ECCs stored in the page 7 (refer to FIG. 5). Also, the area 2 indicates an area for storing an expanded-portion ECC among the ECCs stored in the page 7 (refer to FIG. 5). In this manner, each ECC is separately managed, each ECC size is set to be variable so that performance of data read from the NAND-flash memory 20 is improved compared with a case of increasing a data size of each ECC uniformly. That is to say, for data stored in a deteriorated cell, an ECC data size is increased, and it takes time for data-error detection processing and data correction processing. On the other hand, for data stored in a not-deteriorated cell, an ECC data size is set to be small. And it does not take time for the data-error detection processing and the data correction processing so that, performance of data read from the NAND-flash memory 20 is improved.

And as illustrated in FIG. 10B, the NAND control unit 12 stores a fixed-value ECC1 at a write position of the area 1 specified by the write pointer 1, and stores the expanded ECC2 at an area 2 specified by the write pointer 2. After that, the DMA write control unit 14b moves the write pointer 1 by the size of the fixed value, and also moves the write pointer 2 by the size of the expanded ECC. For example, when writing ECC of Page x1, the NAND control unit 12 stores the fixed-value ECC1 at a write position of the area 1 specified by the write pointer 1, and stores the expanded ECC2 at a write position specified by the write pointer 2. After that, the DMA write control unit 14b moves the write pointer 1 by a fixed-value size, and also moves the write pointer 2 by the expanded ECC size, "a" bytes. In this regard, if an expanded ECC is further expanded, the same processing as described above is performed.

The ECC generation unit 14c generates an ECC in accordance with a data size of the ECC stored in the bad-BLK management table. Specifically, the ECC generation unit 14c is provided with an instruction of the ECC data size together with a generation instruction of an ECC from the DMA write control unit 14b, generates an ECC having an ECC of the instructed data size, and stores the ECC into the ECC buffer 14d.

The ECC buffer 14d temporarily stores the ECC. Specifically, the ECC buffer 14d stores the ECC generated by the ECC generation unit 14c. Also, the ECC buffer 14d stores the ECC read by the NAND control unit 12.

The DMA read control unit 14e controls to perform data read processing on the NAND-flash memory 20. For example, when the DMA read control unit 14e receives a read request from the RoC 30, the DMA read control unit 14e reads an ECC size from the bad BLK management table. And the DMA read control unit 14e determines an ECC-data read position in the ECC buffer 14d on the basis of the ECC size, and notifies a read request to the NAND control unit 12 in order to read ECC data from the NAND-flash memory 20. After that, the DMA read control unit 14e obtains data of which error is corrected by the error-correction control unit 14f from the ECC buffer 14d, and transmits the data to the RoC 30.

Figure 11A:
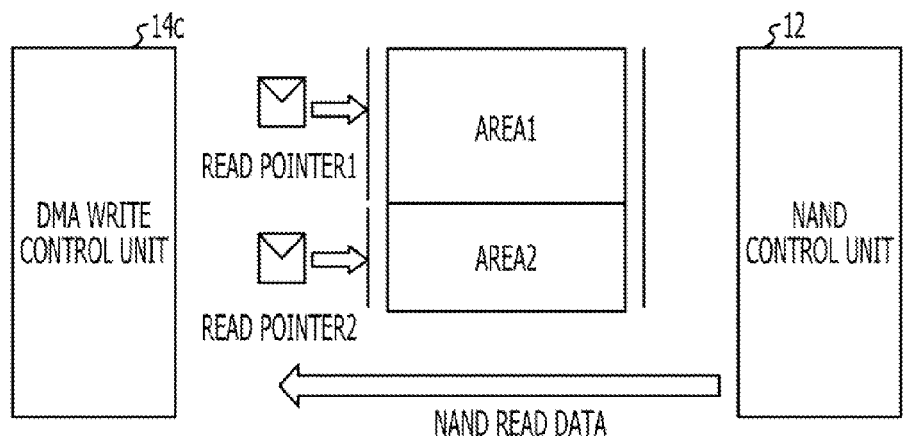
FIGS. 11A and 11B are explanatory diagrams of determination processing of an ECC-data read position.
Figure 11B:
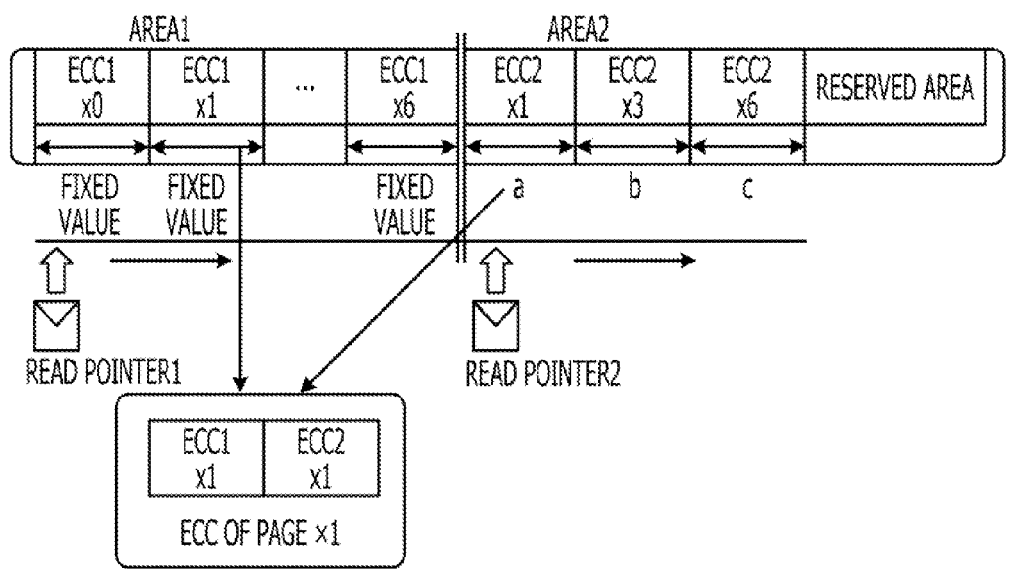

Here, a description will be given of determination processing of an ECC-data read position using FIG. 9, FIG. 11A, and FIG. 11B. FIG. 11A and FIG. 11B are explanatory diagrams of the determination processing of the ECC-data read position. In the bad-BLK management table exemplified in FIG. 9, as described above, in a block having ADR of "1", Page x1 has an ECC size of "a", Page x3 has an ECC size of "b", and Page x6 has an ECC size of "c".

In FIG. 11A and FIG. 11B, a description will be given of determination processing of an ECC-data read position using the example of the bad-BLK management table exemplified in FIG. 9. As illustrated in FIG. 11A, the DMA read control unit 14e controls to move a read pointer 1 and a read pointer 2 so as to specify a read position of each data, and makes the NAND control unit 12 perform data read processing at the specified position. The read pointer 1 specifies a read position of the area 1, and a read pointer 2 specifies a read position of the area 2. The area 1 indicates an area for storing a fixed-value ECC among the ECCs stored in the page 7 (refer to FIG. 5). Also, the area 2 indicates an area for storing an expanded-portion ECC among the ECCs stored in the page 7 (refer to FIG. 5).

And as illustrated in FIG. 11B, the DMA read control unit 14e reads the fixed-value ECC1 at a read position of the area 1 specified by the read pointer 1, and reads the expanded ECC2 from a read position of the area 2 specified by the read pointer 2. After that, the DMA read control unit 14e moves the read pointer 1 by the fixed-value size, and also, moves the read pointer 2 by the expanded ECC size. For example, in the case of reading the ECC of Page x1, the NAND control unit 12 reads the fixed-value ECC1 from the read position of the area 1 specified by the read pointer 1, and reads the expanded ECC2 from the read position of the area 2 specified by the read pointer 2. After that, the DMA read control unit 14e moves the read pointer 1 by the fixed-value size, and also, moves the read pointer 2 by the expanded ECC size, "a" bytes.

Referring back to FIG. 2, the error-correction control unit 14f performs data read processing on the NAND-flash memory 20 for each page, and performs error correction processing using the ECCs. Specifically, the error-correction control unit 14f receives the data and the ECC that are read by the NAND control unit 12, detects an error of the read data using the ECC, and performs correction processing.

Figure 12:
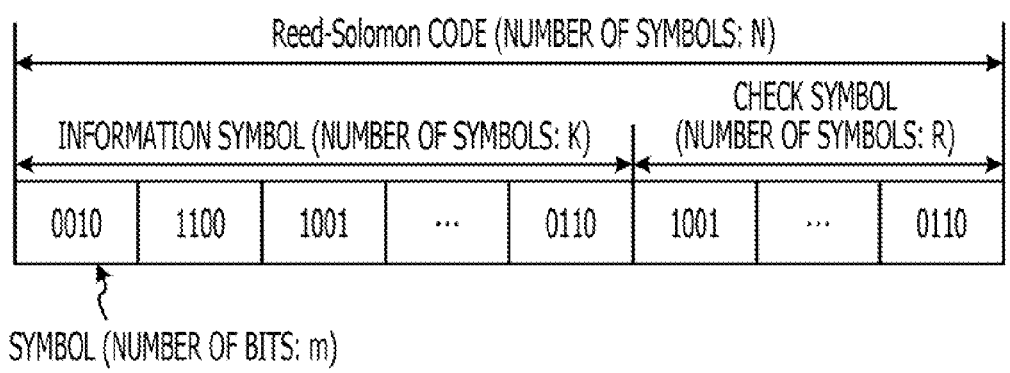
FIG. 12 is an explanatory diagram of an ECC used for error correction.

Here, a description will be given of an error correcting code using FIG. 12. FIG. 12 is a diagram illustrating an ECC used for correcting an error. As exemplified in FIG. 12, a cyclic linear block code, such as a Reed-Solomon code, is used for error correction of the NAND-flash memory 20. And the Reed-Solomon code includes data stored in the NAND-flash memory 20 (described as an information symbol in the example in FIG. 12), and an error correcting code (described as a check symbol in the example in FIG. 12), which is an ECC.

And error correcting ability of a Reed-Solomon code is determined by a size of a check symbol. Specifically, in the case where the number of error symbols is the half of the number of check symbols, the error symbol may be restored to correct error. That is to say, if the number of check symbols is increased, the error correcting ability of the system increases, and thus reliability of data is improved.

Figure 13:
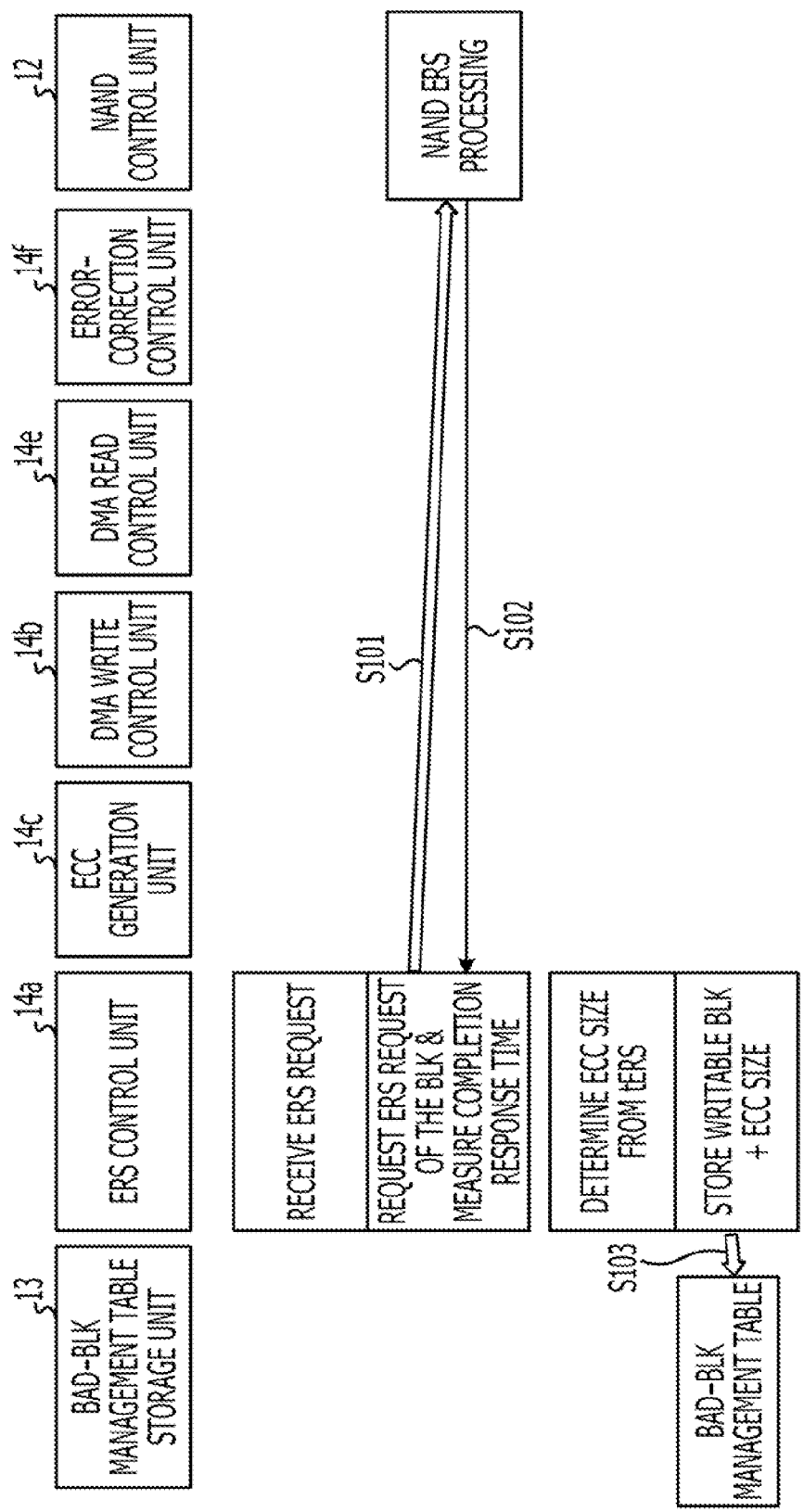
FIG. 13 is an explanatory diagram of erase processing of the NAND-flash memory controller.
Figure 14:
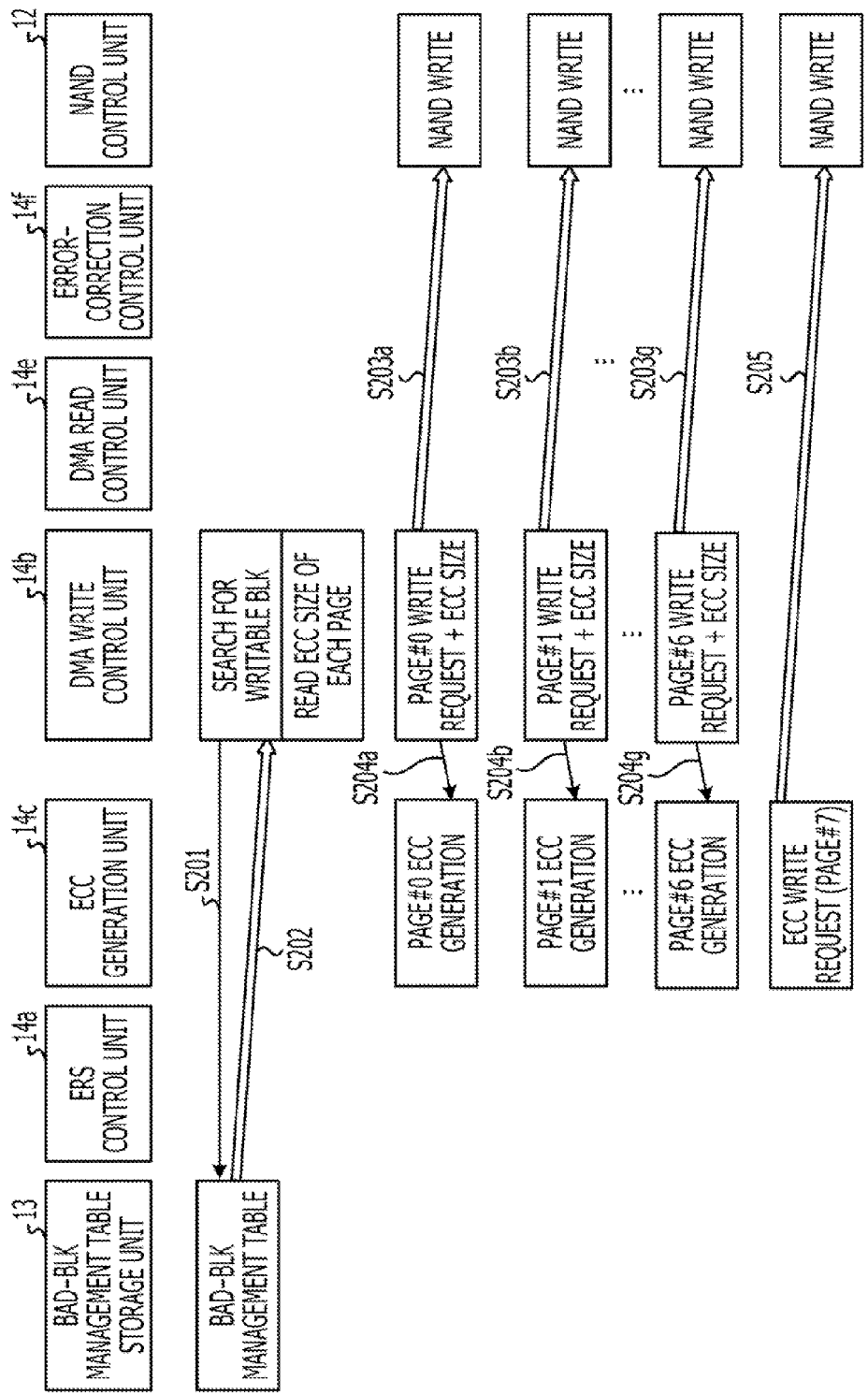
FIG. 14 is a diagram illustrating write processing of the NAND-flash memory controller.
Figure 15:
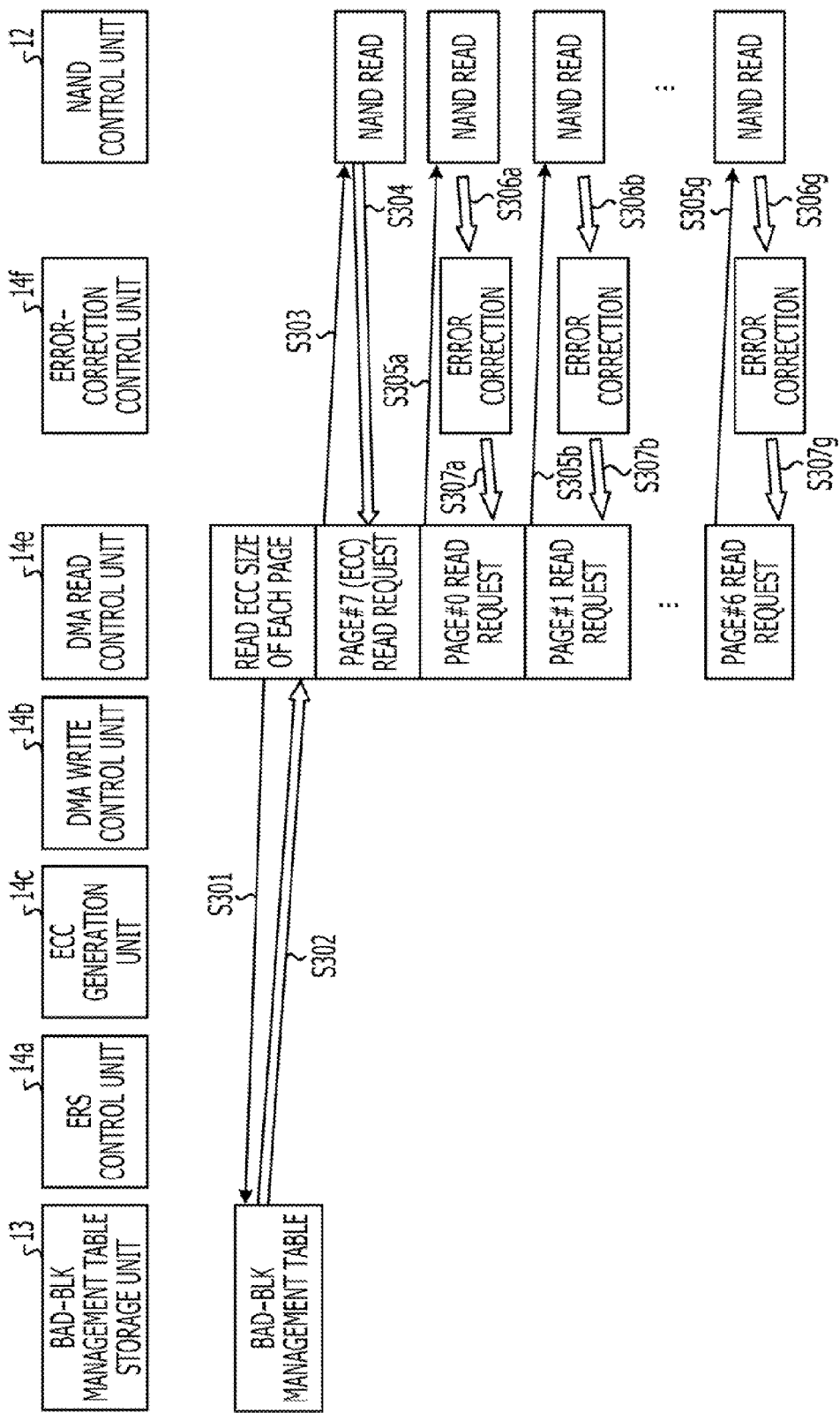
FIG. 15 is a diagram illustrating read processing of the NAND-flash memory controller.

Next, descriptions will be given of erase processing, write processing, and read processing by the NAND-flash memory controller 10 using FIGS. 13 to 15. FIG. 13 is an explanatory diagram of erase processing by the NAND-flash memory controller. FIG. 14 is an explanatory diagram of write processing by the NAND-flash memory controller. FIG. 15 is an explanatory diagram of read processing by the NAND-flash memory controller.

As illustrated in FIG. 13, when the ERS control unit 14a receives an ERS request from the RoC 30, the ERS control unit 14a transmits an ERS request for requesting for erasing data stored in the NAND-flash memory 20 to the NAND control unit 12 (S101).

And the ERS control unit 14a receives a completion response indicating that erase processing has been completed from the NAND control unit 12 (S102). Here, the ERS control unit 14a measures time from transmission of the ERS request to the NAND control unit 12 until reception of a completion response indicating that the erase processing has been completed from the NAND control unit 12 as time needed for erasing data. And the ERS control unit 14a determines a data size of an error correcting code in accordance with the measured time, and stores whether the block is a writable good block or a write-inhibited bad block in the bad-BLK management table.

Next, a description will be given of write processing of the NAND-flash memory controller using FIG. 14. As illustrated in FIG. 14, the DMA write control unit 14b receives a write request from the RoC 30, and receives data to be written, the DMA write control unit 14b reads the bad-BLK management table, and searches for a writable block (S201). That is to say, the DMA write control unit 14b searches for a good block, which has an item of "0" or "1" of the bad BLK code in the bad-BLK management table. And the DMA write control unit 14b reads an ECC size of each page from the bad-BLK management table for a writable block (S202).

And the DMA write control unit 14b controls to perform data write processing on Page#0 to Page#6 of the writable block (S203a to S203g). And the DMA write control unit 14b determines an ECC data size of ECC data read from the bad-BLK management table, and instructs the ECC generation unit 14c to generate an ECC (S204a to S204g). That is to say, if an item of "ECC size" in the bad-BLK management table is "a" bytes, the DMA write control unit 14b controls to generate ECC data with a size of "a" bytes added to a fixed value of the initial setting.

And the DMA write control unit 14b determines an ECC-data write position on the basis of the ECC size, and transmits a write request of the ECC data into the NAND-flash memory 20 (S205). Thereby, the longer time is needed for erasing a page, the larger the size of the ECC for the page is created. Accordingly, the more deteriorated a page is, the larger data size of an ECC for the page may be created. As a result, it is possible to increase reliability of data in the flash memory.

Next, a description will be given of read processing of the NAND-flash memory controller using FIG. 15. As illustrated in FIG. 15, when the DMA read control unit 14e receives a read request from the RoC 30, the DMA read control unit 14e reads an ECC size from the bad-BLK management table (S301 and S302). And the DMA read control unit 14e determines an ECC-data read position on the basis of the ECC size, and notifies a read request for reading an ECC from the NAND-flash memory 20 to the NAND control unit 12 (S303). After that, the DMA read control unit 14e obtains the ECC data (S304), and notifies the ECC data to the error-correction control unit 14f (not illustrated in the figure).

And the DMA read control unit 14e notifies a read request for reading data of Page#0 to Page#6 to be read from the NAND-flash memory 20 to the NAND control unit 12 (S305a to S305g). Next, the error-correction control unit 14f receives the data and the ECC that are read by the NAND control unit 12 for Page#0 to Page#6 (S306a to S306g), detects an error of the read data using the ECC, and performs correction processing. After that, the DMA read control unit 14e receives the data having been subjected to error correction by the error-correction control unit 14f for Page#0 to Page#6 from the ECC buffer 14d (S307a to S307g), and transmits the data to the RoC 30.

[Processing by NAND-Flash Memory Controller]

Figure 16:
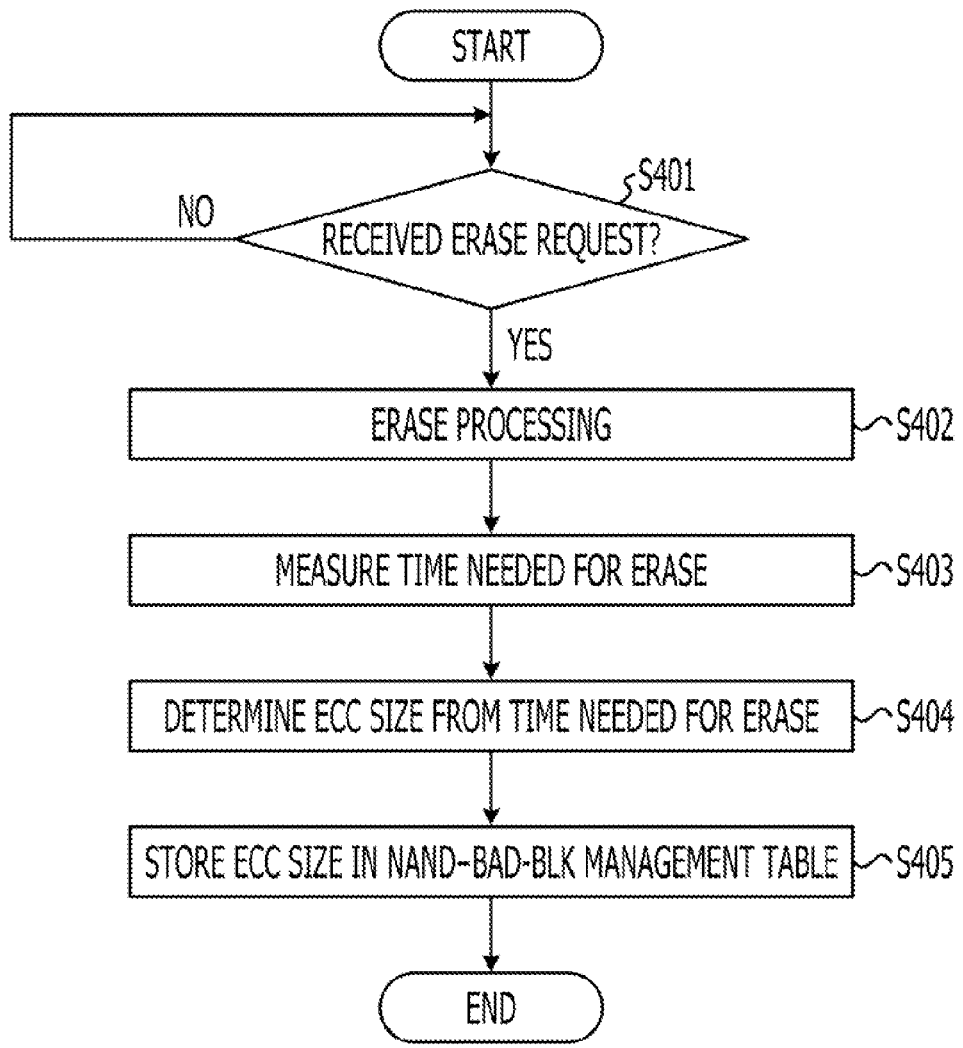
FIG. 16 is a flowchart illustrating operation of erase processing of the NAND-flash memory controller according to the first embodiment.
Figure 17:
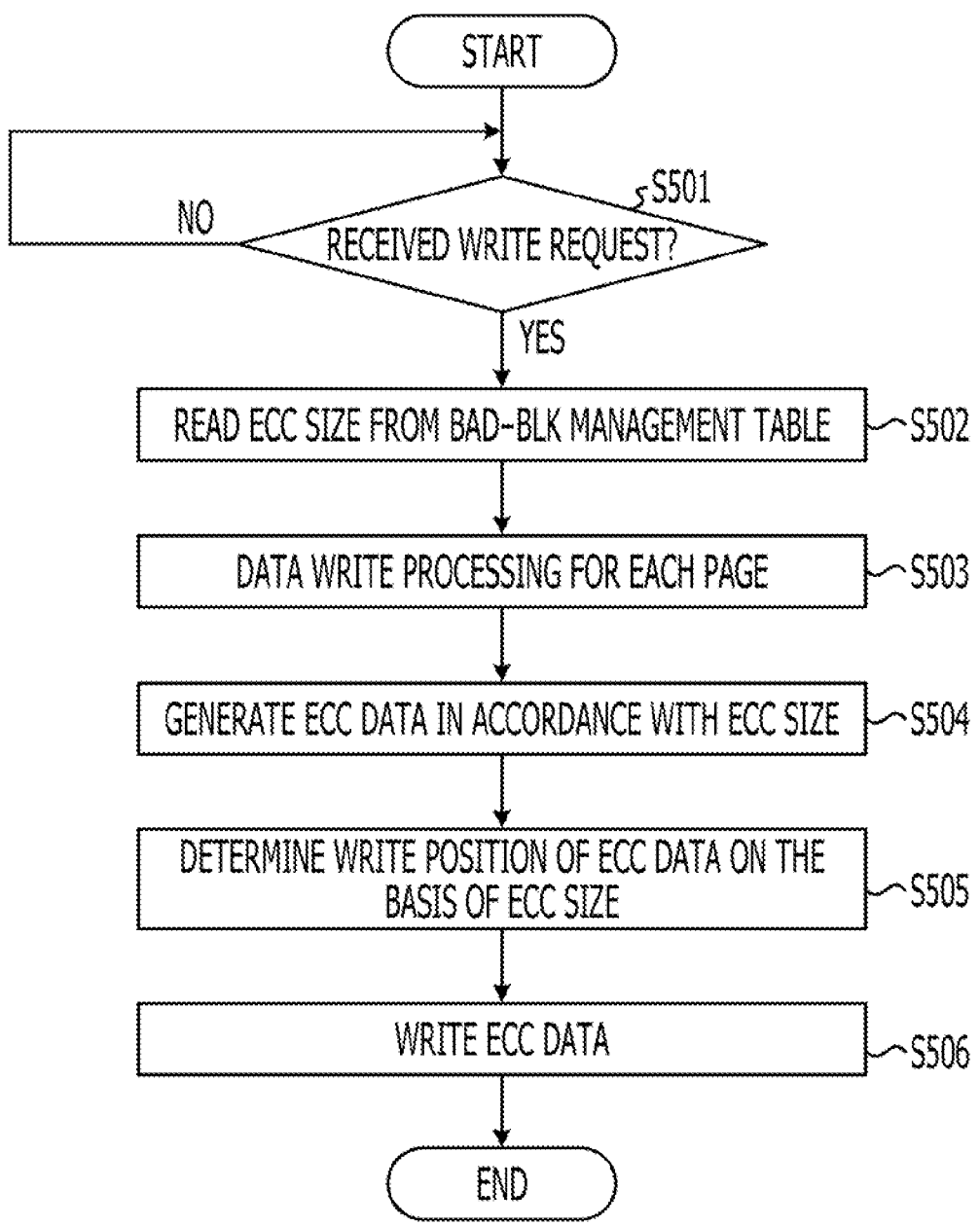
FIG. 17 is a flowchart illustrating operation of write processing of the NAND-flash memory controller according to the first embodiment.
Figure 18:
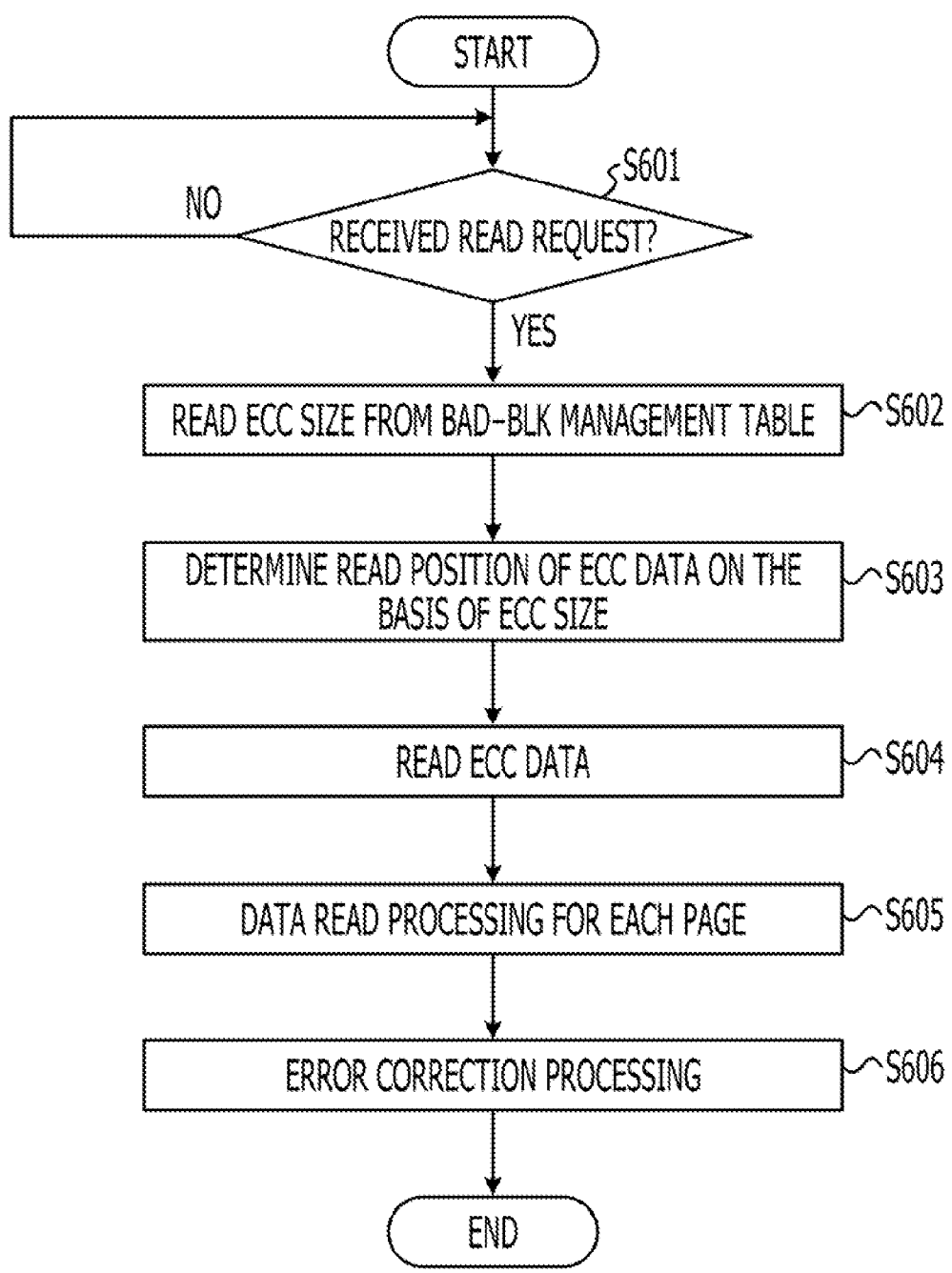
FIG. 18 is a flowchart illustrating operation of read processing of the NAND-flash memory controller according to the first embodiment.

Next, a description will be given of processing by the NAND-flash memory controller 10 according to the first embodiment using FIG. 16 to FIG. 18. FIG. 16 is a flowchart illustrating operation of erase processing of the NAND-flash memory controller according to the first embodiment. FIG. 17 is a flowchart illustrating operation of write processing of the NAND-flash memory controller according to the first embodiment. FIG. 18 is a flowchart illustrating operation of read processing of the NAND-flash memory controller according to the first embodiment.

First, a description will be given of erase processing of the NAND-flash memory controller according to the first embodiment using FIG. 16. As illustrated in FIG. 16, when the NAND-flash memory controller 10 receives an erase request from the RoC 30 (affirmation in S401), the NAND-flash memory controller 10 performs erase processing on the NAND-flash memory 20 (S402).

And the NAND-flash memory controller 10 measures time needed for the erase processing (S403), and determines an ECC size from the time needed for the erase processing (S404). And the NAND-flash memory controller 10 stores the ECC size into the NAND-bad BLK management table (S405).

Next, a description will be given of write processing of the NAND-flash memory controller 10 according to the first embodiment using FIG. 17. As illustrated in FIG. 17, when the NAND-flash memory controller 10 receives a write request from the RoC 30 (affirmation in S501), the NAND-flash memory controller 10 reads an ECC size from the bad BLK management table (S502). And the NAND-flash memory controller 10 performs data write processing in the NAND-flash memory 20 for each page (S503).

And the NAND-flash memory controller 10 generates ECC data in accordance with the ECC size read from the bad-BLK management table (S504). That is to say, the NAND-flash memory controller 10 generates ECC data having a size that is expanded by the size stored in an item of "ECC size" in the bad-BLK management table. And the NAND-flash memory controller 10 determines an ECC-data write position on the basis of the ECC size (S505). After that, the NAND-flash memory controller 10 writes the ECC data into the NAND-flash memory 20 (S506).

Next, a description will be given of read processing of the NAND-flash memory controller 10 according to the first embodiment using FIG. 18. As illustrated in FIG. 18, when the NAND-flash memory controller 10 receives a read request from the RoC 30 (affirmation in S601), the NAND-flash memory controller 10 reads an ECC size from the bad-BLK management table (S602).

And the NAND-flash memory controller 10 determines an ECC-data read position on the basis of the ECC size (S603), and reads the ECC data from the NAND-flash memory 20 (S604). Next, the NAND-flash memory controller 10 performs data read processing on the NAND-flash memory 20 for each page (S605), and performs error correction processing using the ECC (S606).

[Effect of First Embodiment]

As described above, the NAND-flash memory controller 10 measures time needed for erasing data stored in the NAND-flash memory 20, and determines a data size of an error correcting code in accordance with the measured time. And the NAND-flash memory controller 10 generates an error correcting code having the determined data size, and controls to write the generated error correcting code into the NAND-flash memory 20. Accordingly, it is possible to improve data reliability.

That is to say, the longer time is needed for erasing a page, the larger the size of the ECC for the page is created. Accordingly, the more deteriorated a page is, the larger data size of an ECC for the page may be created. As a result, it is possible to increase reliability of data in the flash memory.

Also, by the first embodiment, the NAND-flash memory controller 10 has the bad-BLK management table storage unit 13 storing a data size of a determined error correcting code. When the NAND-flash memory controller 10 writes data stored in the NAND-flash memory 20, the NAND-flash memory controller 10 reads a data size of an error correcting code from the bad-BLK management table storage unit 13. And the NAND-flash memory controller 10 determines a write position of the generated error correcting code in accordance with the data size of the error correcting code, and controls to write the error correcting code at the write position. Accordingly, even if a data size of an error correcting code is changed, it is possible to properly write an error correcting code into the NAND-flash memory 20.

Also, by the first embodiment, the NAND-flash memory controller 10 has the bad-BLK management table storage unit 13 storing the data size of the determined error correcting code. And when the NAND-flash memory controller 10 reads data stored in the NAND-flash memory 20, the NAND-flash memory controller 10 reads a data size of an error correcting code from the bad-BLK management table storage unit 13. And the NAND-flash memory controller 10 determines a read position of the error correcting code stored in the NAND-flash memory 20 in accordance with the data size of the error correcting code, and controls to read the error correcting code from the read position. Accordingly, even if a data size of an error correcting code is changed, it is possible to properly read an error correcting code from the NAND-flash memory 20.

By the first embodiment, the NAND-flash memory controller 10 controls to write the error correcting code into a page different from a page storing the data in the NAND-flash memory 20. Accordingly, it is possible to manage only an error correcting code on a same page, and thus to easily manage the error correcting code even if a data size of the error correcting code has changed.

Second Embodiment

Now, a description has been given of an embodiment to the present technique so far. However, the present technique may be implemented by various kinds of variations other than the above-described embodiment. Thus, in the following, a description will be given of another embodiment included in the present technique as a second embodiment.

(1) System Configuration, etc.

Also, each component of each apparatus illustrated in the figure is functional and conceptual, and is not necessarily configured as illustrated in the figure physically. That is to say, distribution and integration of each apparatus is not limited to a specific configuration illustrated in the figure. It is possible to configure all of or a part of each apparatus in accordance with various loads and use situations, etc., by distributing or integrating the component functionally or physically in any unit. For example, the DMA write control unit 14b and the ECC generation unit 14c may be integrated. Further, all of or any one of each processing function performed by each apparatus may be achieved by a CPU and programs interpreted and executed by that CPU. Alternatively, all of or any one of each processing function may be achieved by hardware on the basis of wired logic.

(2) Programs

In this regard, the error-correction control method described in the present embodiments may be achieved by executing a program provided in advance on a computer, such as a personal computer, a workstation, etc. The program may be distributed through a network, such as the Internet, etc. Also, it is possible to record the program in a computer-readable recording medium, such as a hard disk, a flexible disk (FD), a CD-ROM, an MO, a DVD, etc. And the program may be read from the recording medium and executed by a computer.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An access control apparatus for controlling an access to a storage device, the access control apparatus comprising:
a measuring unit configured to measure an erase time to erase data stored in the storage device;

a determination unit configured to determine a data size of an error correcting code added to data stored in the storage device in accordance with the erase time, the data size being equal to a predetermined size when the erase time is less than or equal to a predetermined time;

a generation unit configured to generate the error correcting code having the data size determined by the determination unit; and an access controller configured to write the data and the error correcting code generated by the generation unit into the storage device.

2. The access control apparatus according to claim 1, further comprising:

a storage unit configured to store the data size of the error correcting code determined by the determination unit, wherein when the access controller writes data into the storage device, the access controller reads the data size of the error correcting code from the storage unit, determines a write position of the error correcting code generated by the generation unit based on the data size of the error correcting code, and controls writing of the error correcting code at the write position.

3. The access control apparatus according to claim 1, further comprising:

a storage unit configured to store the data size of the error correcting code determined by the determination unit, wherein when the access controller reads data stored in the storage device, the access controller reads the data size of the error correcting code from the storage unit, and determines a read position of the error correcting code stored in the storage device based on the data size of the error correcting code, and reads the error correcting code from the read position.

4. The access control apparatus according to claim 1, wherein the access controller writes the error correcting code into a storage area different from a storage area used for storing data in the storage device.

5. The access control apparatus according to claim 1, wherein the data size is equal to a first predetermined size times a second predetermined size when the erase time is greater than a predetermined time.

6. A storage apparatus comprising:

a storage device configured to store data; and a controller configured to measure an erase time to erase data stored in the storage device, determine a data size of an error correcting code added to data stored in the storage device in accordance with the erase time, generate the error correcting code having the determined data size, and write the data and the generated error correcting code into the storage device, the data size being equal to a predetermined size when the erase time is less than or equal to a predetermined time.

7. The storage apparatus according to claim 6, further comprising:

a storage unit configured to store the determined data size of the error correcting code, wherein when the controller writes data into the storage device, the controller reads the data size of the error correcting code from the storage unit, and determines a write position of the generated error correcting code based on the data size of the error correcting code and controls writing of the generated error correcting code at the write position.

8. The storage apparatus according to claim 6, further comprising a storage unit configured to store the data size of the determined error correcting code, wherein when the controller reads data stored in the storage device, the controller reads the data size of the error correcting code from the storage unit, and determines a read position of the error correcting code stored in the storage device based on the data size of the error correcting code, and reads the error correcting code from the read position.

9. The storage apparatus according to claim 6, wherein the controller writes the error correcting code into a storage area different from a storage area used for storing data in the storage device.

10. The storage apparatus according to claim 6, wherein the data size is equal to a first predetermined size times a second predetermined size when the erase time is greater than a predetermined time.

11. A method of controlling a storage apparatus configured to control an access to a storage device, the method comprising:

measuring an erase time to erase data stored in the storage device;

determining, by the controller, a data size of an error correcting code added to data stored in the storage device in accordance with the erase time, the data size being equal to a predetermined size when the erase time is less than or equal to a predetermined time;

generating an error correcting code having the determined data size; and writing the data and the generated error correcting code into the storage device.

12. The method according to claim 11, further comprising:

reading, when writing data into the storage device, the data size of the error correcting code from a storage unit;

determining a write position of the generated error correcting code based on the data size of the error correcting code; and writing the generated error correcting code at the write position.

13. The method according to claim 11, further comprising:

reading, when reading data stored in the storage device, the data size of the error correcting code from a storage unit; and determining a read position of the error correcting code stored in the storage device based on the data size of the error correcting code to read the error correcting code from the read position.

14. The method according to claim 11, wherein the writing includes writing the error correcting code into a storage area different from a storage area used for storing data in the storage device.

15. The method according to claim 11, wherein the data size is equal to a first predetermined size times a second predetermined size when the erase time is greater than a predetermined time.

* * * * *